United States Patent
Hwang et al.

(10) Patent No.: US 8,254,181 B2
(45) Date of Patent: Aug. 28, 2012

(54) NONVOLATILE MEMORY DEVICE AND PROGRAMMING METHOD

(75) Inventors: Soonwook Hwang, Suwon-si (KR); Kitae Park, Seongnam-si (KR); Jaewook Lee, Seoul (KR); Han Sung Joo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 374 days.

(21) Appl. No.: 12/581,479

(22) Filed: Oct. 19, 2009

(65) Prior Publication Data
US 2010/0128532 A1    May 27, 2010

(30) Foreign Application Priority Data
Nov. 24, 2008  (KR) .................. 10-2008-0116886

(51) Int. Cl.
*G11C 16/06* (2006.01)
*G11C 16/34* (2006.01)
*G11C 16/24* (2006.01)
*G11C 16/10* (2006.01)

(52) U.S. Cl. ......... 365/185.25; 365/185.24; 365/185.22; 365/185.17; 365/185.18; 365/185.11; 365/185.13

(58) Field of Classification Search ............. 365/185.29, 365/185.27, 185.25, 185.24, 185.22, 185.23, 365/185.17, 185.18, 185.13, 185.11
See application file for complete search history.

(56) References Cited

U.S. PATENT DOCUMENTS

| | | | |
|---|---|---|---|
| 5,798,966 A * | 8/1998 | Keeney | ........... 365/185.18 |
| 6,891,758 B2 | 5/2005 | Roohparvar | |
| 2006/0152981 A1 | 7/2006 | Ryu | |
| 2008/0205160 A1 | 8/2008 | Kim et al. | |

FOREIGN PATENT DOCUMENTS

| | | |
|---|---|---|
| KR | 1020020036273 A | 5/2002 |
| KR | 1020060014342 A | 2/2006 |
| KR | 1020080056970 A | 6/2008 |
| KR | 1020080079500 A | 9/2008 |

* cited by examiner

*Primary Examiner* — J. H. Hur
(74) *Attorney, Agent, or Firm* — Volentine & Whitt, PLLC

(57) ABSTRACT

A nonvolatile memory device includes; a memory cell array configured into a plurality of memory blocks, a decoder connected to the plurality of memory blocks via a word line, a page buffer connected to the plurality of memory blocks via a bit line, and control logic configured to define a control voltage applied to at least one of the word line and the bit line during a program/verify operation in accordance with a location of each one of the plurality of memory blocks within the memory cell array.

9 Claims, 13 Drawing Sheets

NONVOLATILE MEMORY DEVICE AND PROGRAMMING METHOD

CROSS-REFERENCE TO RELATED APPLICATION

This U.S. nonprovisional patent application claims priority under 35 U.S.C. §119 to Korean Patent Application 10-2008-0116886, filed on Nov. 24, 2008, the subject matter of which is hereby incorporated by reference.

BACKGROUND

The present inventive concept relates to nonvolatile memory devices. More particularly, the inventive concept relates to a flash memory device providing a post programming operation in order to improve a pass voltage window and a method of programming the flash memory device.

The nonvolatile memory devices include a variety of resistance variable type devices, including flash memory devices. Contemporary flash memory devices may be generally classified as NAND flash memory and NOR flash memory. NOR flash memory includes memory cells independently connected to bit lines and word lines. NOR flash memory is widely used in applications requiring random data access. In contrast, NAND flash memory includes a plurality of series connected memory cells. Only a single connection contact is required for the resulting cell string. NAND flash memory is thus characterized by very high integration density.

Additional improvements in flash memory integration density have been facilitated by the use of multi-bit memory cells. Multi-bit memory cells operate with two or more threshold voltage distributions, each corresponding to a stored data state. A multi-bit memory cell is commonly referred to as Multi-Level Cell (MLC), and a single bit memory cell is referred to as a Single-Level Cell (SLC).

SUMMARY

Embodiments of the inventive concept provide a post programming method for a nonvolatile memory device capable of improving a pass voltage window.

In one aspect, an embodiment of the inventive concept provides a nonvolatile memory device comprising; a memory cell array configured into a plurality of memory blocks, a decoder connected to the plurality of memory blocks via a word line, a page buffer connected to the plurality of memory blocks via a bit line, and a control logic configured to define a control voltage applied to at least one of the word line and the bit line during a program/verify operation in accordance with a location of each one of the plurality of memory blocks within the memory cell array.

In another one aspect, an embodiment of the inventive concept provides a computational system comprising; a memory controller, and a nonvolatile memory device operating in accordance with commands received from the memory controller. The nonvolatile memory device comprises; a memory cell array configured into a plurality of memory blocks, a decoder connected to the plurality of memory blocks via a word line, a page buffer connected to the plurality of memory blocks via a bit line, and a control logic configured to define a control voltage applied to at least one of the word line and the bit line during a program/verify operation in accordance with a location of each one of the plurality of memory blocks within the memory cell array.

In another one aspect, an embodiment of the inventive concept provides a method of programming a nonvolatile memory device, the nonvolatile memory device being configured into a plurality of memory blocks including a top memory block located at one end of a bit line and a bottom memory block located at an opposite end of the bit line, the method comprising; executing an erase operation for memory cells of the top memory block and memory cells of the bottom memory block, and then executing a post programming operation for the memory cells of the top memory block and memory cells of the bottom memory block, such that respective threshold voltage distributions for the memory cells of the top memory block and memory cells of the bottom memory block are substantially similar.

BRIEF DESCRIPTION OF THE DRAWINGS

The accompanying drawings are included to provide a further understanding of the inventive concept, and are incorporated in and constitute a part of this specification. The drawings illustrate certain embodiments of the inventive concept and, together with the description, serve to explain principles of the inventive concept. In the drawings.

DETAILED DESCRIPTION OF EMBODIMENTS

Embodiments of the inventive concept will now be described with reference to the accompanying drawings. The inventive concept may, however, be embodied in many different forms and should not be construed as being limited to only the illustrated embodiments. Rather, these embodiments are presented as teaching examples.

In a flash memory performing a programming operation using the so-called "min-max way", the closer string selection lines (SSLs) suffer disproportionately from the program disturbance phenomenon. In one aspect, embodiments of the inventive concept provide a post programming operation to improve a pass voltage window. The post programming operation enables a threshold voltage distribution to have a constant level following an erase operation executed within a nonvolatile memory device. That is, if a post programming operation according to an embodiment of the inventive concept is executed, the threshold voltage distribution of constituent memory cells within a nonvolatile memory device will be constant. Accordingly, the corresponding pass voltage window may be improved.

As is well understood by those skilled in the art, a pass voltage window defines a range of pass voltages across which a pass voltage disturb and program voltage disturb do not occur. Therefore, as the range of the pass voltage window increases, the stability of programming operations being executed in relation to a nonvolatile memory device is also increased. And greater stability yields higher memory device reliability.

Figure 1:
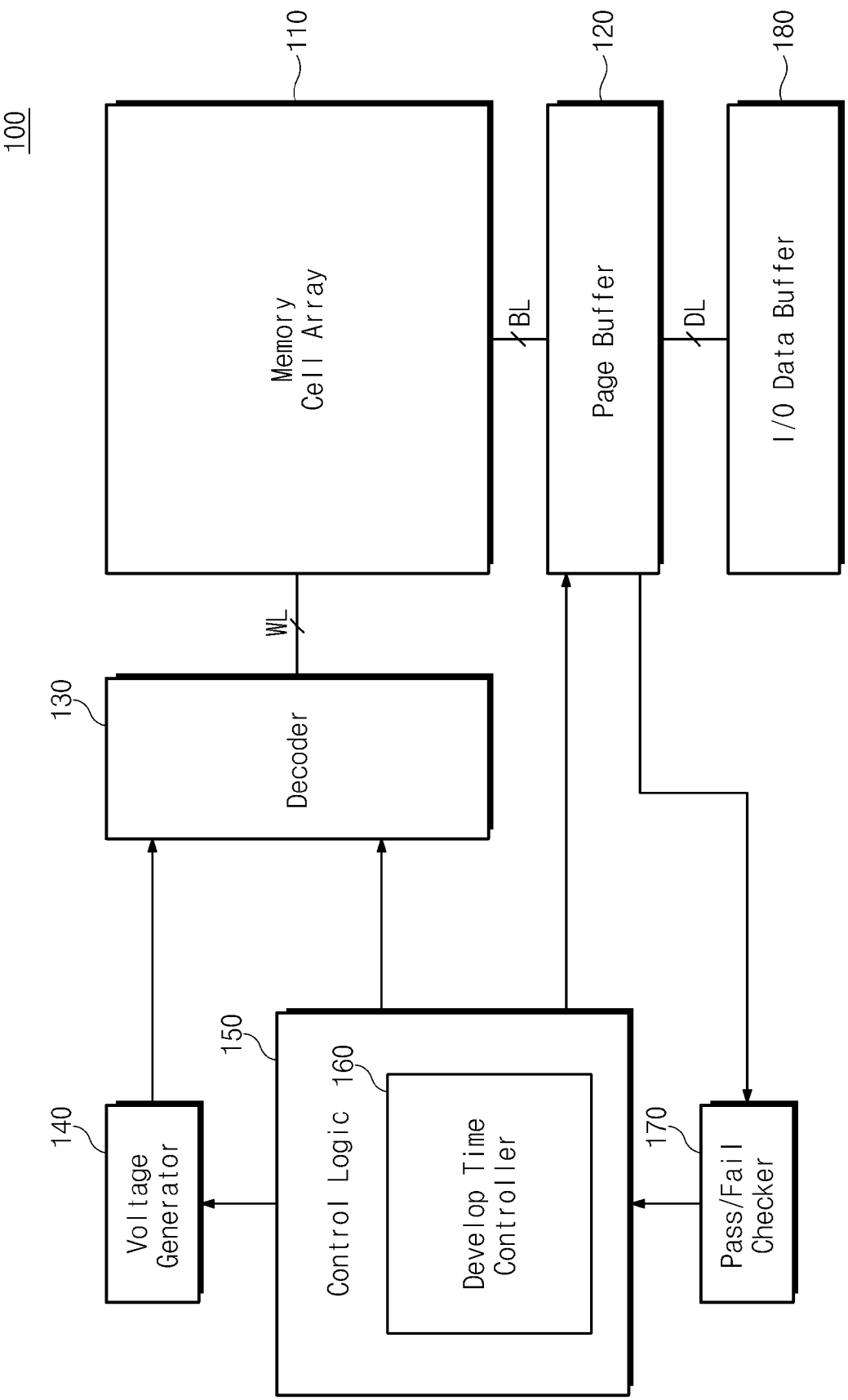
FIG. 1 is a block diagram of a memory device according to an embodiment of the inventive concept.

Figure (FIG. 1 is a block diagram of a memory device according to an embodiment of the inventive concept. Referring to FIG. 1, a memory device 100 is a nonvolatile memory device, and may be implemented as a flash memory device, a Phase-change Random-Access Memory (PRAM), a Magneto-resistive Random-Access Memory (MRAM), or a Resistive Random-Access Memory (RRAM).

However constituted with a particular type of nonvolatile memory cell, the memory device 100 will generally be configured to be controlled in response to commands (or instructions) received from a corresponding memory controller. The memory controller may take many different forms including a Central Processing Unit (CPU), a microprocessor, an error detection and correction device (ECC), a buffer memory, etc.

The memory device 100 illustrated in FIG. 1 comprises a memory cell array 110 incorporating SLCs and/or MLCs capable of storing M-bit data, where M is a positive integer. The memory cell array 110 may be divided into a plurality of regions. These regions may include a data region storing general data and a spare region. Each region of the memory cell array 110 may be configured by a plurality of memory blocks. Since the configuration of the memory block is well known to those skilled in the art, the description thereof will be omitted.

The memory device 100 also comprises a page buffer 120, a decoder 130, a voltage generator 140, a control logic 150, a pass/fail checker 170, and an I/O data buffer 180.

The page buffer 120 is configured to read/program data from/to the memory cell array 110 by the control of the control logic 150. The decoder 130 is controlled by the control logic 150 and configured to select the memory block of the memory cell array 110 and to select a word line of the selected memory block. The selected word line may be driven by a word line voltage from the voltage generator 140. The voltage generator 140 is controlled by the control logic 150 and configured to generate certain voltages (e.g., a read voltage, a program voltage, a pass voltage, a local voltage, and/or a verifying voltage) supplied to the memory cell array 110.

The pass/fail checker 170 communicates read data received from the page buffer 120 to the control logic 150. During a read operation, the I/O data buffer 180 receives the read data from the page buffer 120 and communicates the received read data to an external device (not shown). During a program operation, the I/O data buffer 180 receives externally supplied write data to the page buffer 120. The control logic 150 is configured to control the overall operation of the memory device 100.

Figure 2:
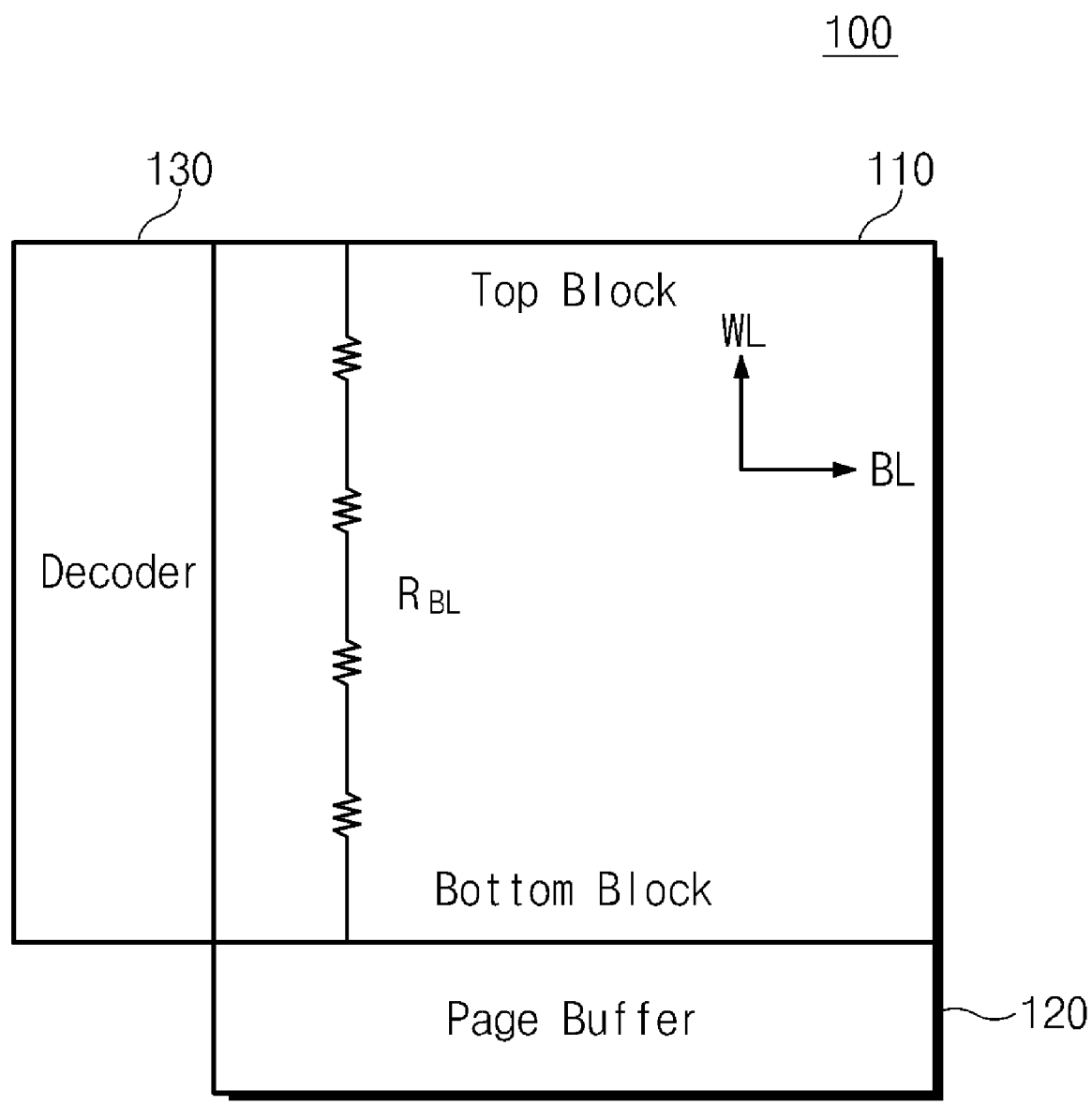
FIG. 2 is a block diagram further illustrating the cell array, decoder, and page buffer circuits of FIG. 1.

As illustrated in FIG. 2, the memory cell array 110 may be configured as a plurality of blocks. Constituent bit lines may be connected between a bottom block and a top block within the memory cell array 110. That is, each bit line connected to the page buffer 120 of FIG. 1 may extend between the bottom block and top block of the memory cell array 110. Accordingly, the resistance $R_{BL}$ exhibited by the bit line at its top block connection point(s) will be markedly greater than the analogous resistance $R_{BL}$ exhibited by the bit line at its bottom block connection point(s). Due to this difference in bit line resistance, among other factors, a post programming operation will result in a difference (or "gap") between a "top threshold voltage distribution" for memory cells in the top block and a "bottom threshold voltage distribution" for memory cells in the bottom block.

In order to address this potential problem, the control logic 150 may be further configured to include a develop time controller 160 adapted to control (or define) a develop time during programming operations and verify operations. The concept of "develop time" is well understood by those skilled in the art, and the controller 160 as further configured is capable of defining an appropriate develop time controlling the operation of the page buffer 120. Properly controlled operation of the page buffer 120 in relation to a timing interval defined by the develop time during programming and verify operation is necessary for accurate definition of threshold voltage distributions across the entire memory cell array 110. In essence, the develop time defines a discharge period following precharging of a bit line by the page buffer 120. As will be described in some additional detail with reference to FIGS. 3 through 6, the develop time controller 160 of FIG. 1 may be used to control a develop time during the programming and verify operations according to embodiments of the inventive concept.

Figure 3:
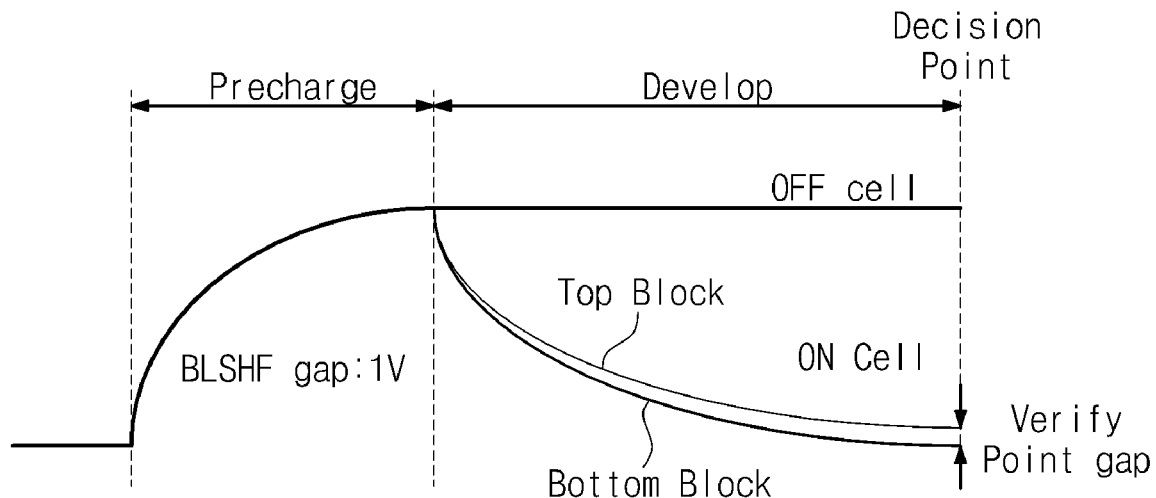
FIG. 3 is a timing diagram illustrating a programming operation for the memory device of FIG. 2.
Figure 4:
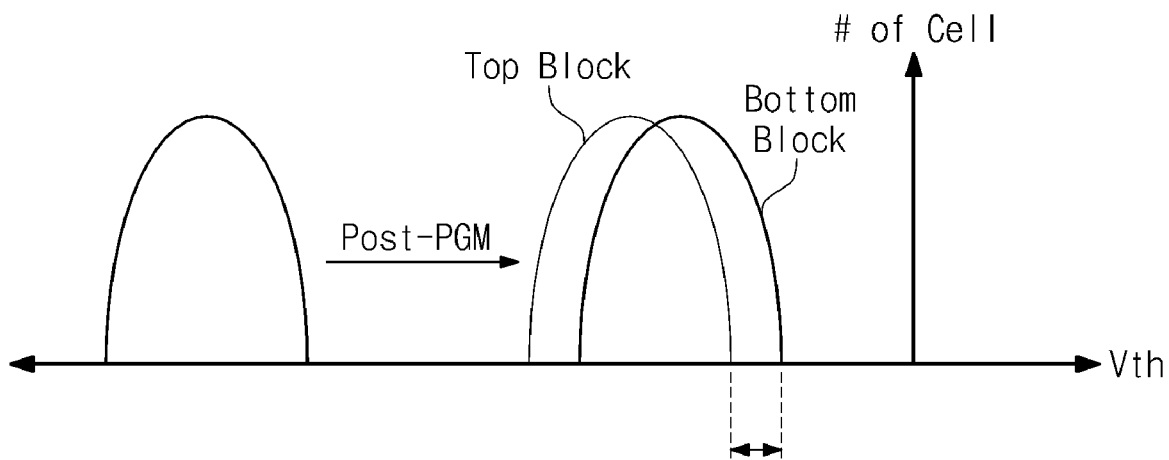
FIG. 4 is a graph illustrating a threshold voltage distribution for the memory device of FIG. 3.

FIG. 3 is a timing diagram illustrating a programming operation for the memory device of FIG. 2. FIG. 4 is a related graph illustrating threshold voltage distributions for the memory device illustrated in FIGS. 2 and 3.

According to certain embodiments of the inventive concept, a post programming operation is equivalent in its nature and means of application to a preceding programming operation. Therefore, the post programming operation may be regularly applied within a nonvolatile memory device according to an embodiment of the inventive concept just as the programming operation is applied.

As illustrated in FIG. 3, a post programming operation according to an embodiment of the inventive concept may comprise a program/verify operation. Referring to FIG. 3 and assuming an ON-cell case, the post programming operation causes the verify point gap between the discharge curve for a top block memory cell and the discharge curve for a bottom block memory cell over a commonly defined develop interval. As noted above, this verify point gap between top and bottom memory cell discharge curves over a commonly defined develop interval is due in large part to the difference in the resistance $R_{BL}$ of the bit line extending from the top block to bottom block. Therefore, if a post programming operation is executed as suggested by FIG. 3, there is a distinct possibility of a gap being created between respective threshold voltage distributions for the top block and bottom block. See, FIG. 4.

Figure 5:
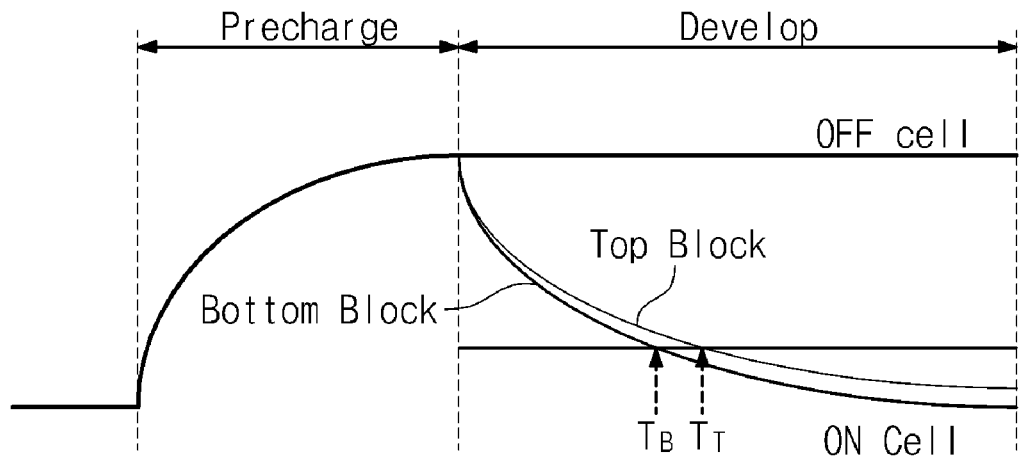
FIG. 5 is a timing diagram illustrating a programming operation for the memory device of FIG. 1.
Figure 6:
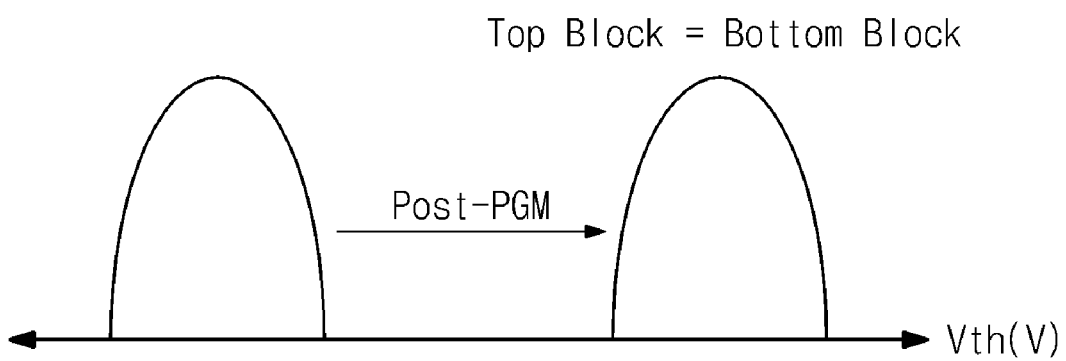
FIG. 6 is a graph illustrating a threshold voltage distribution for the memory device of FIG. 5.

FIG. 5 is a timing diagram illustrating a programming operation for the memory device illustrated in FIG. 1 according to an embodiment of the inventive concept. FIG. 6 is a graph illustrating threshold voltage distributions for the memory device of FIGS. 1 and 5.

Referring to FIG. 5 and again assuming an ON-cell case, the illustrated post programming operation not-unexpectedly causes a verify point gap to form between the top block memory cell and bottom block memory cell discharge curves over the develop interval. However, the post programming operation of FIG. 5 is controlled such that develop times, as between the memory cells in the top block and memory cells in the bottom block, are varied so that the top block threshold voltage distribution and bottom block threshold voltage distribution are maintained in equal states. That is, as suggested by FIG. 5, a top block develop time is defined by a second time $T_T$, while a bottom block develop time is defined by an earlier occurring second time $T_B$.

As illustrated in FIG. 6, the respective threshold voltage distributions for the top block and bottom block are made substantially similar by controlling the top block develop time and the bottom block develop time.

Figure 7:
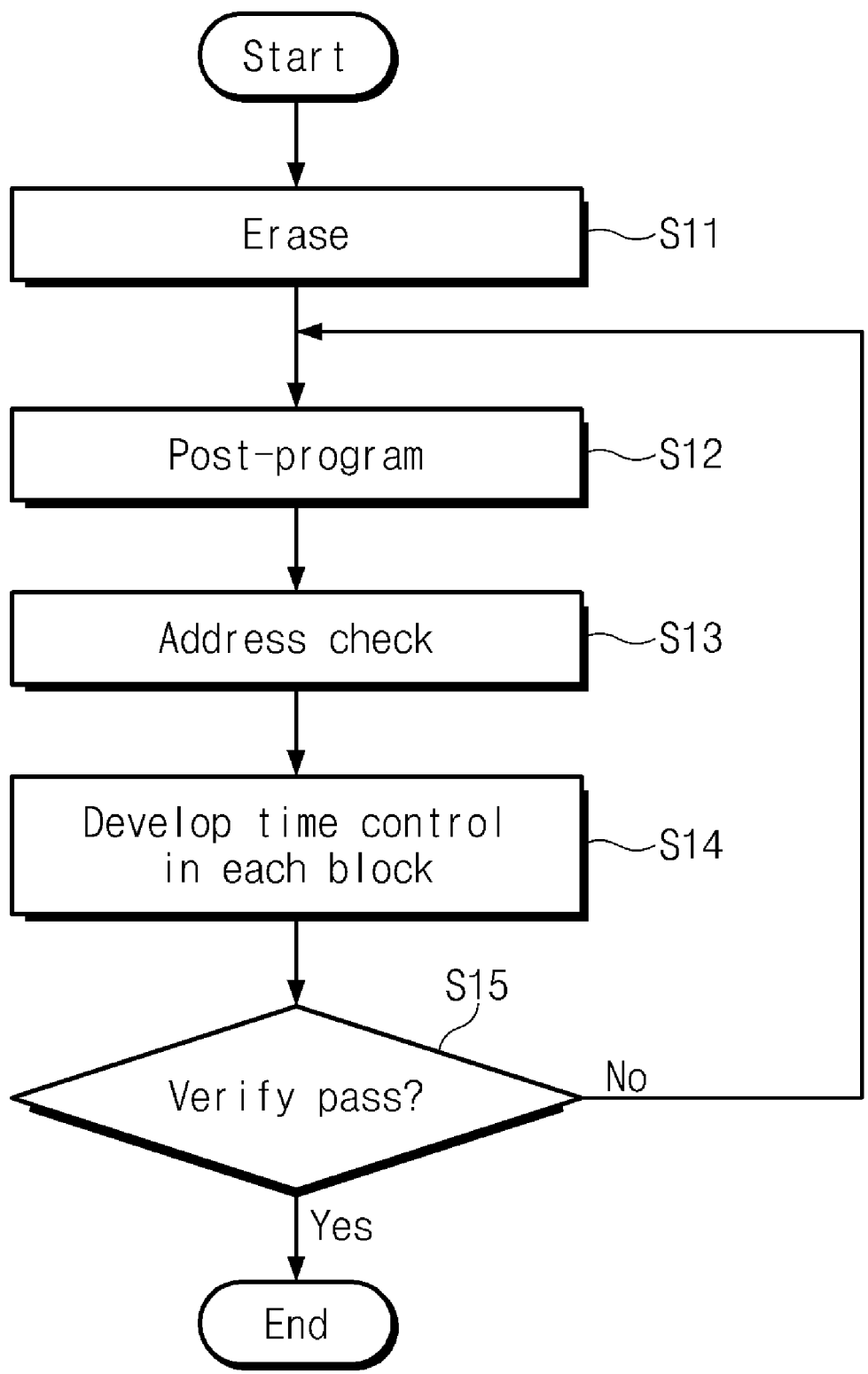
FIG. 7 is a flowchart summarizing a post programming operation executed in relation to the memory device of FIG. 1.

FIG. 7 is a flowchart summarizing a post programming operation for the memory device of FIG. 1. Referring to FIG. 7, the illustrated post programming operation comprises: executing an erase operation (S11); executing a post programming operation (S12); determining the physical location of a current block within the memory array according to its input address (S13); controlling a develop time for the current block in relation to its location (S14); and then verifying whether the post programming operation data to correct (i.e., whether a "passed" condition exists) (S15). If passed, the process ends, but if not passed, the process loops back to the step of executing the post programming operation (S12).

Figure 8:
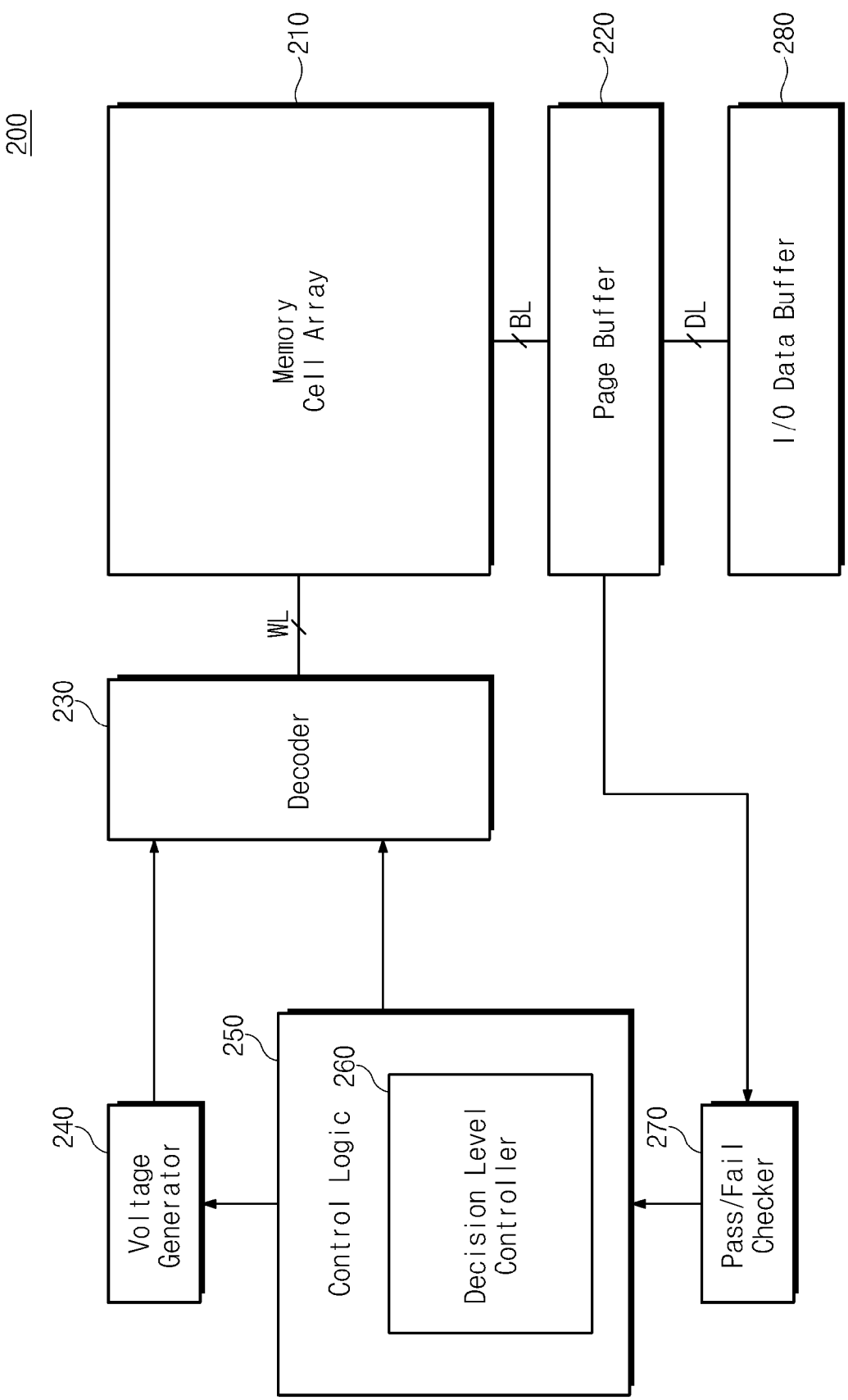
FIG. 8 is a block diagram of a memory device according to another embodiment of the inventive concept.

FIG. 8 is a block diagram of a memory device according to another embodiment of the inventive concept. The memory device 200 of FIG. 8 is substantially similar to the memory device 100 of FIG. 1, except for a decision level controller 260 is incorporated within the control logic 250.

Referring to FIG. 8, the memory device 200 analogously comprises; a memory cell array 210, a page buffer 220, a decoder 230, a voltage generator 240, a control logic 250, a pass/fail checker 270, and an I/O data buffer 280.

Consistent with the memory cell array illustrated in FIG. 2, the memory cell array 210 is configured into a plurality of blocks and bit lines extending from a bottom block to a top block across the memory cell array 210. As before, the length of the each bit line yields a different resistance for connections points at the top block and the bottom block. Accordingly, if a post programming operation is routinely executed, a gap will arise between the respective threshold voltage distributions for memory cells in the top block and memory cells in the bottom block.

In order to address this potential problem, the control logic 250 is further configured to include a decision level controller 260 adapted to define a decision level during the program/verify operation. The decision level controller 260 determines the decision level for the decoder 230 during the develop interval of the program/verify operation. The decision level is essentially a verifying voltage applied to a selection word line. A decision level controller 260 configured to control the decision level during a program/verify operation according to an embodiment of the inventive concept will be described in some additional detail with reference to FIG. 9.

Figure 9:
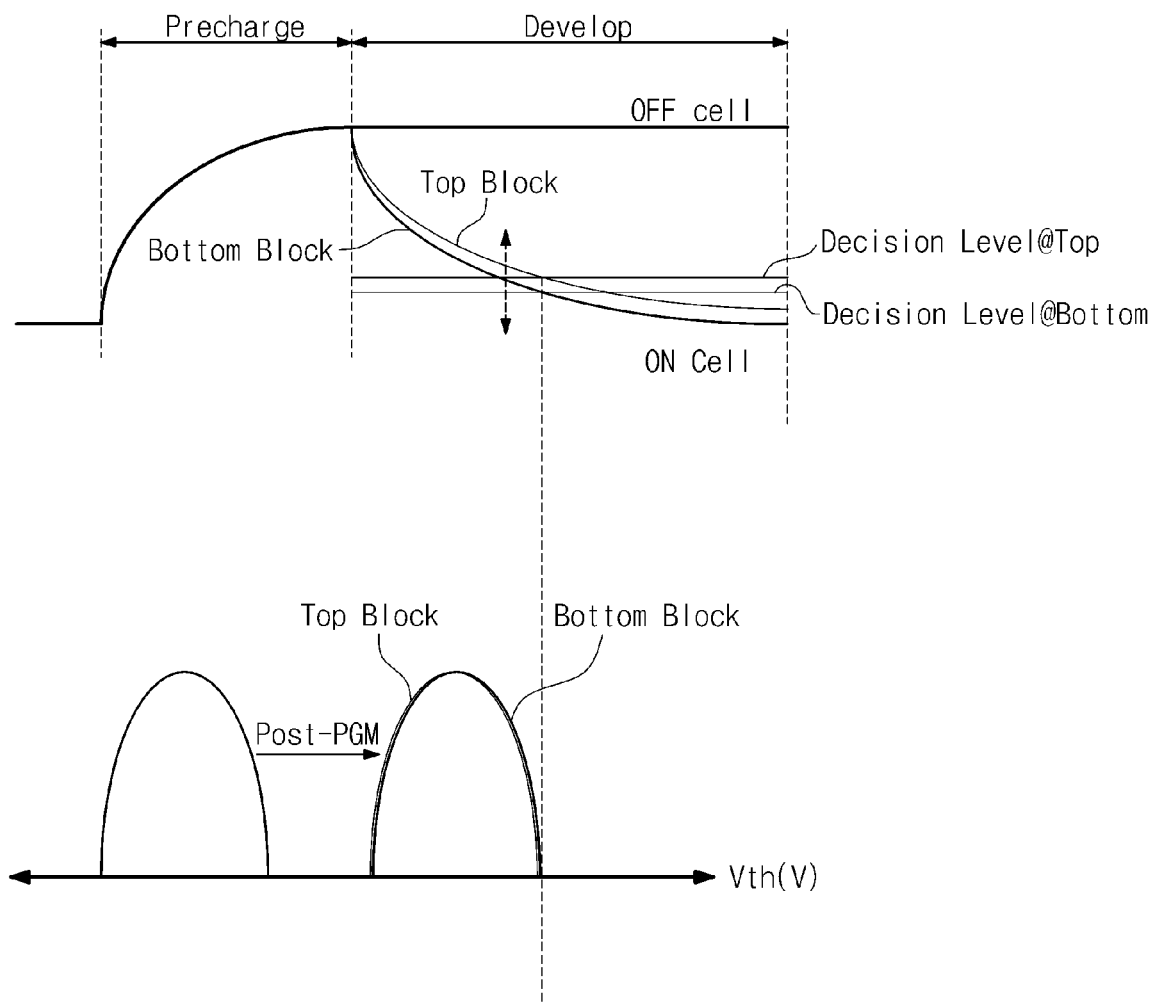
FIG. 9 is a timing diagram illustrating a programming operation for the memory device of FIG. 8, and a related graph illustrating threshold voltage distributions related to the programming operation.

FIG. 9 is a timing diagram illustrating the programming operation according to an embodiment of the inventive concept and a related graph illustrating threshold voltage distributions according to the programming operation.

Referring to FIG. 9 and assuming an ON-cell case, the post programming operation causes a verify point gap between the discharge curve of the top block and the discharge curve of the bottom block to be generated at the develop interval. That is, there is the verify point gap between the discharge curve of the top block and the discharge curve of the bottom block at the develop interval due to the difference in resistance between the top block and the bottom block.

The post programming operation controls the decision level between the top block and the bottom block so that the threshold voltage distribution between the top block and the bottom block is maintained at a constant level. That is, one decision level for the memory cells in the top block is defined at a top block decision level (Decision Level@Top), and another decision level for memory cells in the bottom block is defined as a bottom block decision level (Decision Level@Bottom). Accordingly, the respective threshold voltage distributions for memory cells in the top block and bottom block becomes substantially similar by controlling the decision level between the top block and the bottom block.

Figure 10:
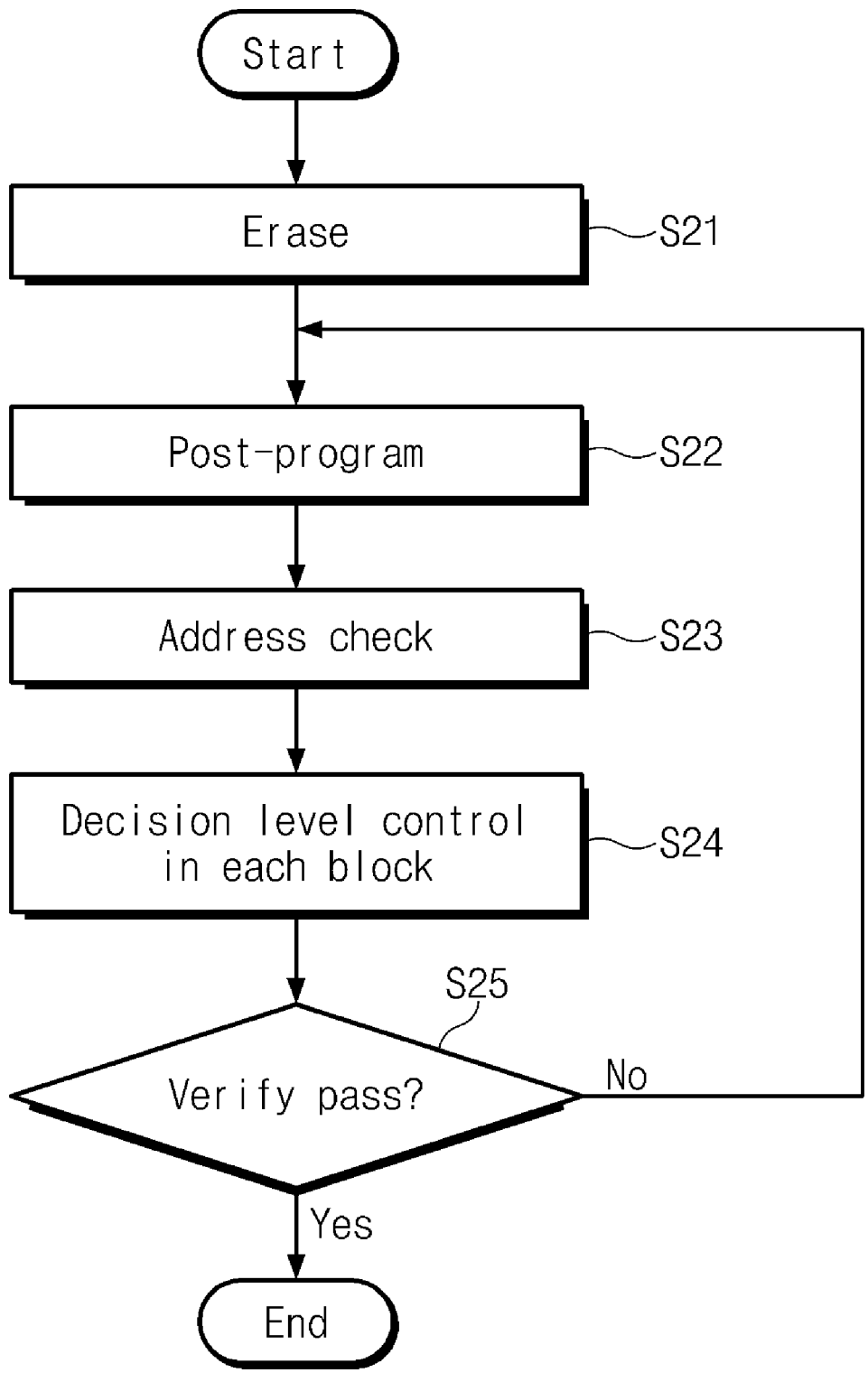
FIG. 10 is a flowchart summarizing a post programming operation for the memory device of FIG. 8.

FIG. 10 is a flowchart summarizing a post programming operation for the memory device of FIG. 8. Referring to FIG. 10, the post programming method comprises: executing an erase operation (S21); executing a post programming operation (S22); determining the physical location of a current block according to its input address (S23); controlling a decision level for the current block in accordance with its physical location (S24); and checking for a passed condition (S25). If passed, the process ends, but if not passed, the process returns to the step of executing the post programming operation (S22).

Figure 11:
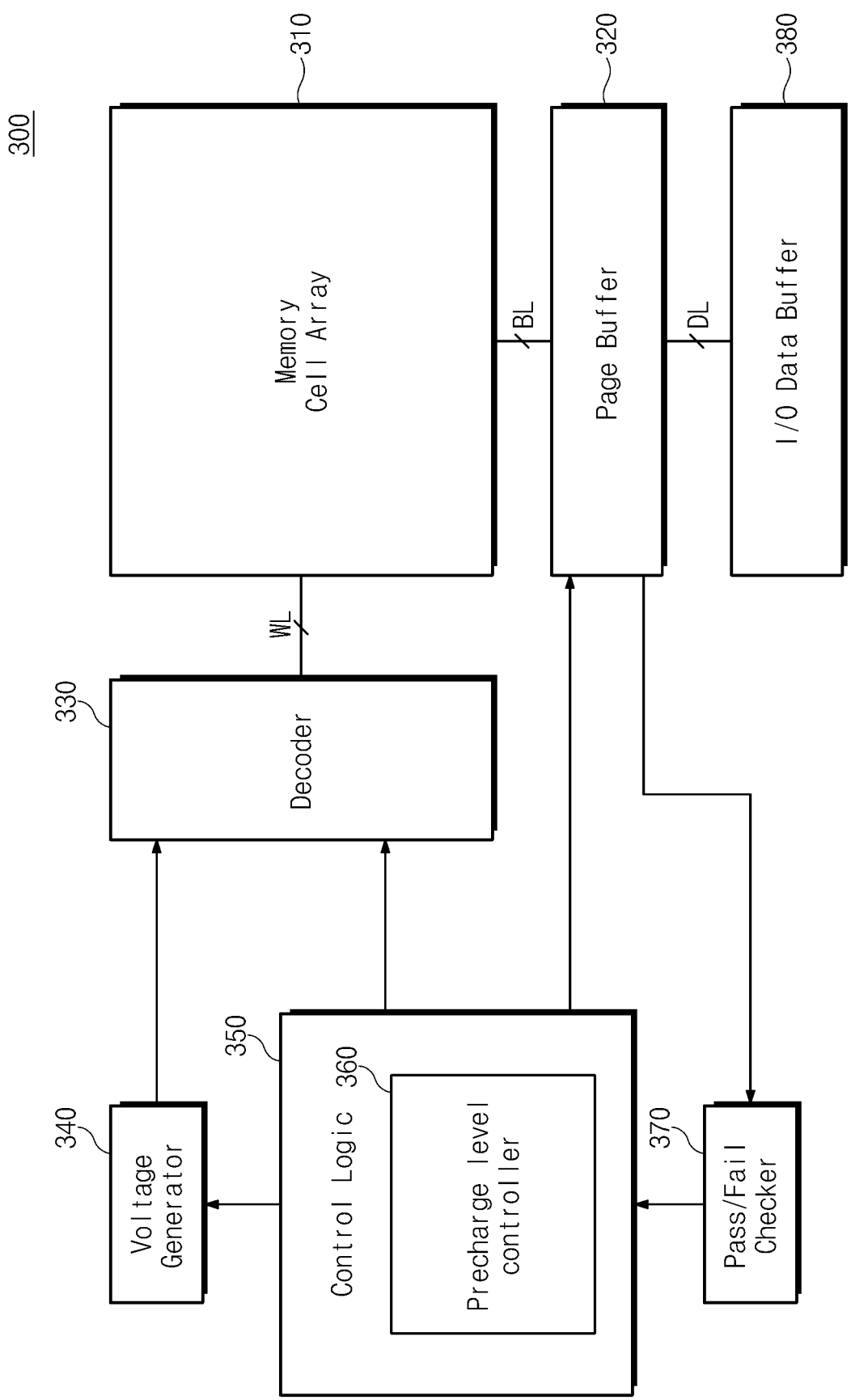
FIG. 11 is a block diagram of a memory device according to yet another embodiment of the inventive concept.

FIG. 11 is a block diagram of a memory device according to yet another embodiment of the inventive concept. The memory device 300 is substantially the same as the memory device 100 of FIG. 1, except for a precharge level controller 360 is included in the control logic 350.

Referring to FIG. 11, the memory device 300 analogously comprises; a memory cell array 310, a page buffer 320, a decoder 330, a voltage generator 340, a control logic 350, a pass/fail checker 370, and an I/O data buffer 380.

Consistent with FIG. 2, the memory cell array 310 is configured by a plurality of blocks, and a bit line is connected to a bottom block from a top block of the memory cell array 310. That is, the bit line connected to the page buffer 320 illustrated in FIG. 11 is connected to the bottom block from the top block of the memory cell array 310. Accordingly, the resistance $R_{BL}$ of the bit line connected to the top block may be higher than that of the bit line connected to the bottom block. As a result, if the post programming operation is executed, there is a gap between the threshold voltage distribution of the memory cell in the top block and the threshold voltage distribution of the memory cell in the bottom block.

In order to address this potential problem, the control logic 350 is further configured to incorporate a precharge level controller 360 adapted to control a precharge level during the program/verify operation. The precharge level controller 360 determines the precharge level of the page buffer 320 at a develop interval during the programming and verify operation. The precharge level controller 360 configured to control the precharge level during the program/verify operation according to an embodiment of the inventive concept will be described in some additional detail with reference to FIG. 12.

Figure 12:
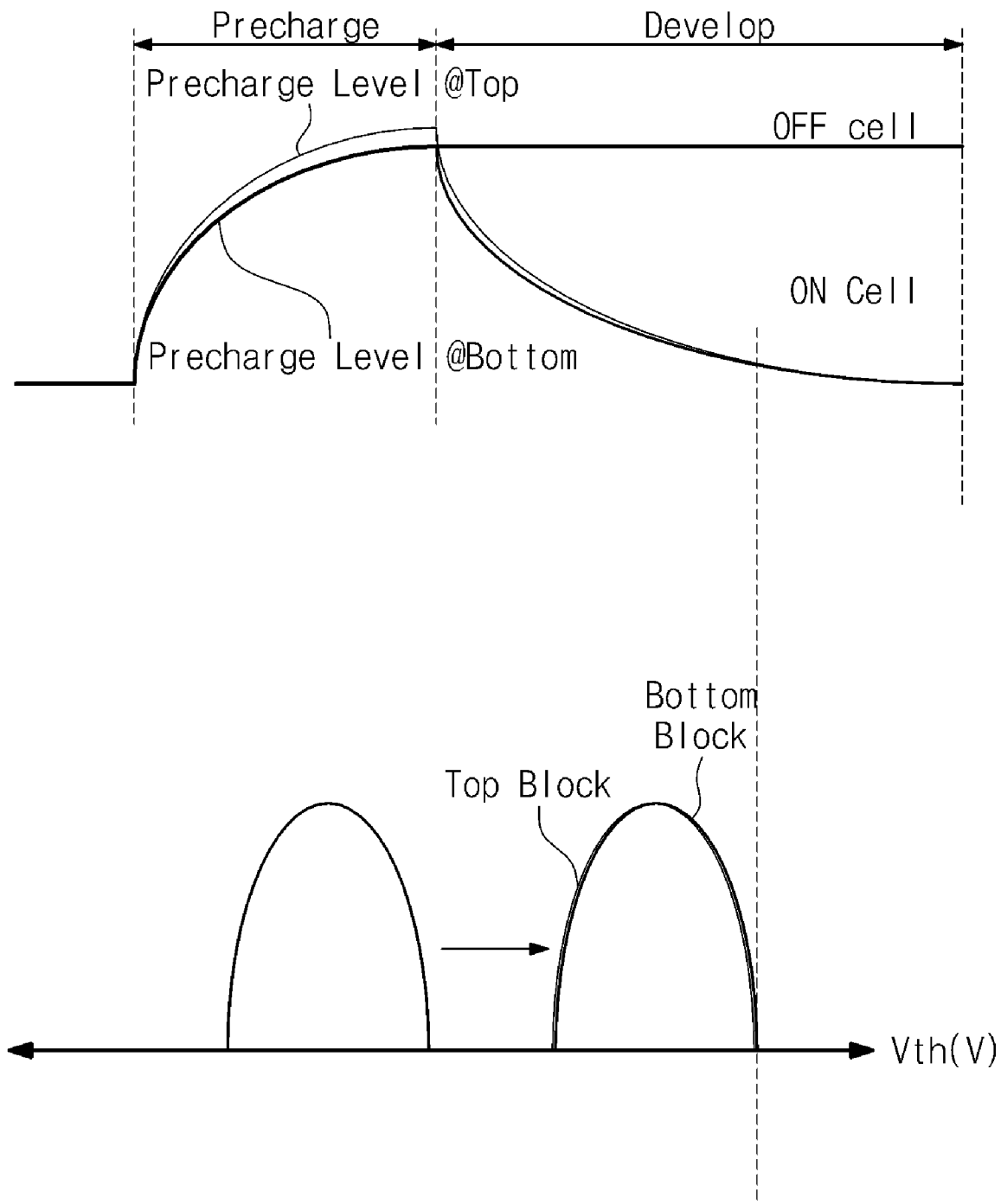
FIG. 12 is a timing diagram illustrating a programming operation for the memory device of FIG. 11, and a related graph illustrating threshold voltage distributions related to the programming operation.

FIG. 12 is a timing diagram illustrating a programming operation for the memory device of FIG. 11 and a related graph illustrating threshold voltage distributions according to the programming operation.

Referring to FIG. 12 and assuming an ON-cell case, the post programming operation causes the verify point gap between the discharge curve of the top block and the discharge curve of the bottom block to be generated at the develop interval. That is, there is the verify point gap between the discharge curve of the top block and the discharge curve of the bottom block at the develop interval due to the difference in resistance between the top block and the bottom block.

The post programming operation controls the precharge level between the top block and the bottom block so that the threshold voltage distribution between the top block and the bottom block is maintained at a constant level. That is, the precharge level of the top block is defied as a top block precharge level (Precharge Level@Top), and the precharge level of the bottom block is defined as a bottom precharge level (Precharge Level@Bottom). Accordingly, the threshold voltage distribution between the top block and the bottom block becomes the same level or very similar level by controlling the decision level between the top block and the bottom block.

Figure 13:
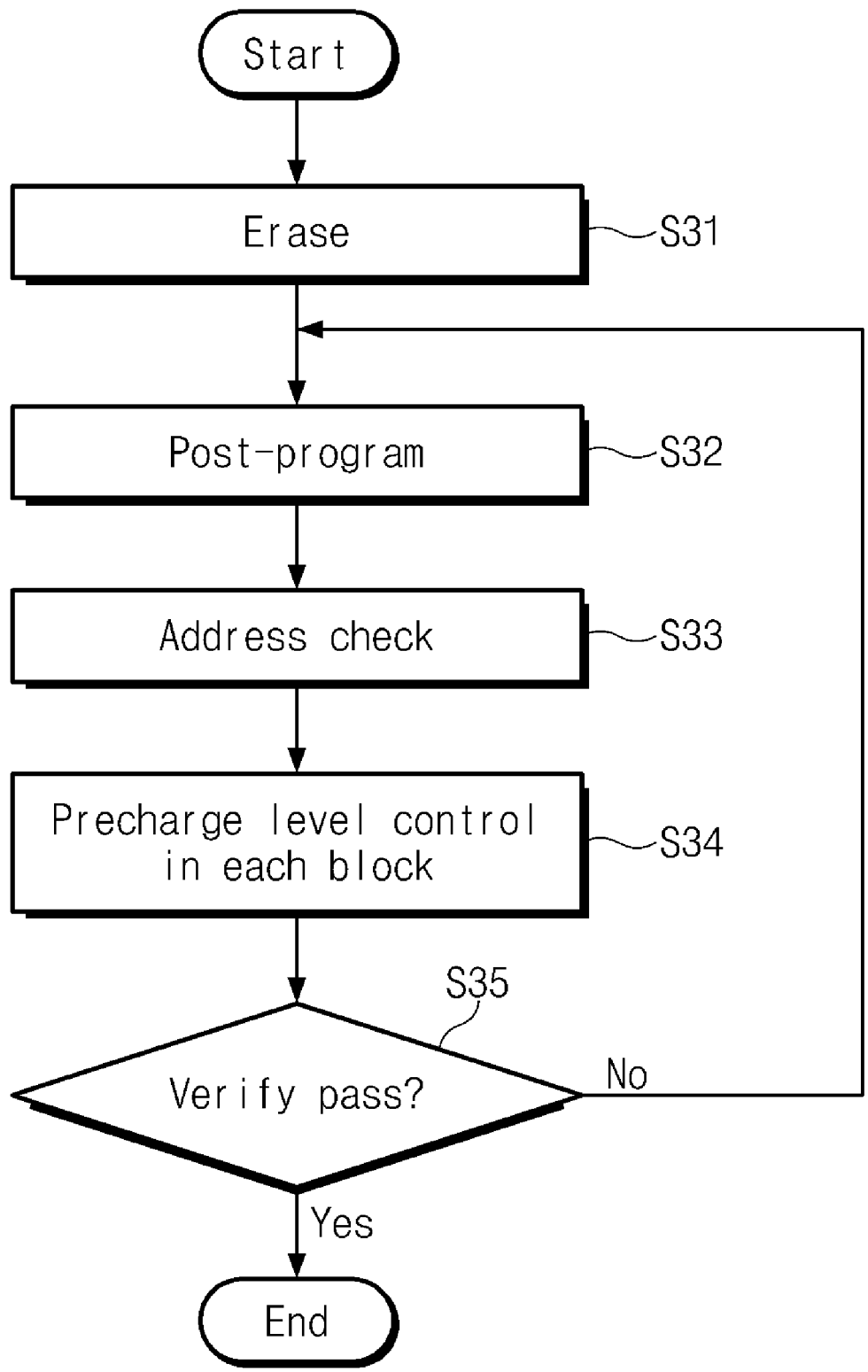
FIG. 13 is a flowchart summarizing a post programming operation for the memory device of FIG. 11.

FIG. 13 is a flowchart summarizing a post programming operation for the memory device of FIG. 11. Referring to FIG. 13, the post programming method comprises: executing an erasing operation (S31); executing a post programming operation (S32); determining a position of a block by checking an input address (S33); controlling a precharge level corresponding to the position of the block (S24); and checking whether to pass (S25). If passed, the process ends, but if not passed, the process returns to step S32.

Within the context of certain embodiments of the inventive concept, the pass voltage will vary according to, for example, a conventionally understood Incremental Step Pulse Programming (ISSP) technique. However, the foregoing adjustment techniques may be readily incorporated within this type of incremental pass voltage adjustment in order to improve the resulting pass voltage window.

Figure 14:
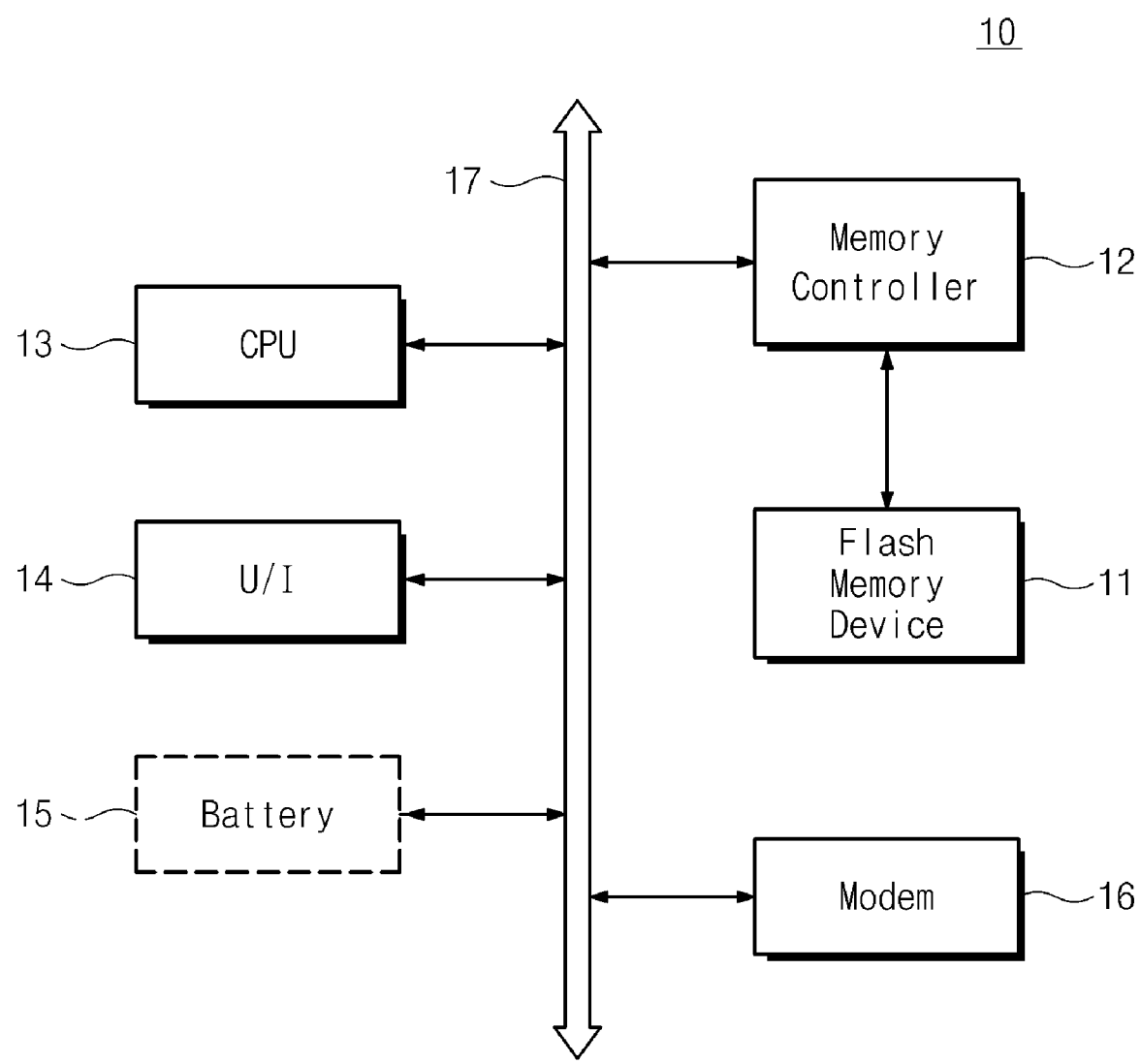
FIG. 14 is a block diagram of a computational system including the memory system according to an embodiment of the inventive concept.

FIG. 14 is a block diagram of a computational system including the memory system according to an embodiment of the inventive concept. Thus, even though applied power source is interrupted, the nonvolatile memory system will retain stored data. The computational system of FIG. 14 may be a mobile device, such as a cellular phone, PDA digital camera, portable game console, MP3 player, etc. The memory system formed by memory controller 12 and (e.g.,) flash memory device 11 may be used to store programming code for the system as well as payload data.

The computational system of FIG. 14 generally comprises a memory system (11 and 12) according to an embodiment of the inventive concept. It also comprises a Central Processing Unit (CPU) 13, a user interface 14, a modem 16 such as a baseband chipset, and a bus 17. The memory controller 12 controls the flash memory device 11. N-bit data, where N is a positive integer, is processed by the CPU 13 and stored in the flash memory device 11 via the memory controller 12.

In a case where the computational system is a mobile device, a battery 15 will additionally be provided so as to supply operational voltage of the computing system. Although not illustrated in the drawings, it will be apparent to those skilled in the art that an application chipset, a Camera Image Processor (CIS), a mobile DRAM, and so on can further be provided to the computing system.

The memory controller 12 and the flash memory device 11 may be configured by a Solid State Drive/Driver (SSD) using the nonvolatile memory in storing data. An exemplary SSD is disclosed, for example, in U.S. Patent Application Publication No. 20060152918, the subject matter of which is incorporated by reference.

Figure 15:
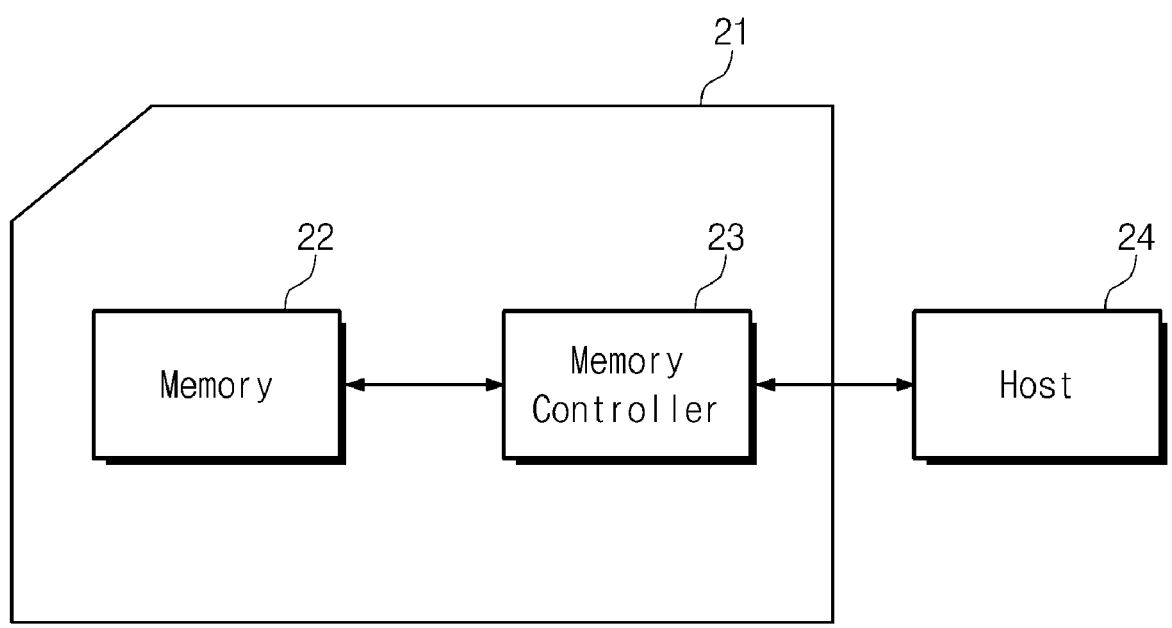
FIG. 15 is a block diagram illustrating a memory-based storage device according to an embodiment of the inventive concept.

FIG. 15 is a block diagram illustrating a memory-based storage device according to another embodiment of the inventive concept. A memory-based storage device 20 illustrated in FIG. 15 is embodied so as to configure a card 21 provided with a memory 22 and a memory controller 23. For example, the card 21 may be a memory card such as a flash memory card. That is, the card 21 may be a card satisfying any industrial standard for using electronic equipment such as a digital camera or a personal computer. It will be understood that the memory controller 23 can control the memory 22 based on control signals received by the card 21 or from a host 24.

According to the illustrated embodiments of the inventive concept, a pass voltage window may be improved so that threshold voltage distributions for constituent memory cell across a memory cell array may be maintained at a constant level during a post programming operation.

Although the inventive concept has been described in connection with certain illustrated embodiments, the inventive concept is not limited thereto. It will be apparent to those skilled in the art that various substitution, modifications and changes may be thereto without departing from the scope of the following claims.

What is claimed is:

1. A nonvolatile memory device comprising:
   a memory cell array configured into a plurality of memory blocks;
   a decoder connected to the plurality of memory blocks via a word line;
   a page buffer connected to the plurality of memory blocks via a bit line; and
   a control logic configured to define a control voltage applied to at least one of the word line and the bit line during a program/verify operation in accordance with a location of each of the plurality of memory blocks within the memory cell array,
   wherein the control voltage defines a develop time during which a precharge voltage is discharged, the precharge voltage being applied to the bit line.

2. The nonvolatile memory device of claim 1, wherein the plurality of memory blocks is series connected to the bit line; and
   the control logic is further configured to increase the develop time for each one of the plurality of memory blocks as a location of each memory block increases from one end of the bit line.

3. The nonvolatile memory device of claim 1, wherein the program/verify operation comprises:
   executing an erase operation for memory cells of a top memory block and memory cells of a bottom memory block within the plurality of memory blocks; and then
   executing a post programming operation for the memory cells of the top memory block and memory cells of the bottom memory block, such that respective threshold voltage distributions for the memory cells of the top memory block and memory cells of the bottom memory block are substantially similar.

4. A computational system comprising:
   a memory controller; and
   a nonvolatile memory device operating in accordance with commands received from the memory controller, the nonvolatile memory device comprising:
   a memory cell array configured into a plurality of memory blocks;
   a decoder connected to the plurality of memory blocks via a word line;
   a page buffer connected to the plurality of memory blocks via a bit line; and
   control logic configured to define a control voltage applied to at least one of the word line and the bit line during a program/verify operation in accordance with a location of each of the plurality of memory blocks within the memory cell array, wherein the control voltage defines a develop time during which a precharge voltage is discharged, and the precharge voltage is applied to the bit line.

5. The computational system of claim 4, wherein the plurality of memory blocks is series connected to the bit line; and
the control logic is further configured to increase develop time for each one of the plurality of memory blocks as a location of each memory block increases from one end of the bit line.

6. A method of programming a nonvolatile memory device, the nonvolatile memory device being configured into a plurality of memory blocks including a top memory block located at one end of a bit line and a bottom memory block located at an opposite end of the bit line, the method comprising:
executing an erase operation for memory cells of the top memory block and memory cells of the bottom memory block; and then
executing a post programming operation for the memory cells of the top memory block and the memory cells of the bottom memory block, such that respective threshold voltage distributions for the memory cells of the top memory block and memory cells of the bottom memory block are substantially similar.

7. The method of claim 6, wherein executing the post programming operation comprises:
using a different develop time for the top memory block and the bottom memory block during which a precharge voltage is discharged, wherein each respective precharge voltage is applied to the bit line.

8. The method of claim 6, wherein executing the post programming operation comprises:
using a different verifying voltage for the top memory block and the bottom memory block, wherein each respective verifying voltage is applied to a word line.

9. The method of claim 6, wherein executing the post programming operation comprises:
using a different precharge voltage to the top memory block and the bottom memory block, wherein each respective precharge voltage is applied to the bit line.

* * * * *